(12) United States Patent
Ilzhoefer

(10) Patent No.: US 9,312,414 B2
(45) Date of Patent: Apr. 12, 2016

(54) DEVICE FOR SUPPORTING AT LEAST ONE SOLAR PANEL

(71) Applicant: Werner Ilzhoefer, Hassfurt (DE)

(72) Inventor: Werner Ilzhoefer, Hassfurt (DE)

( * ) Notice: Subject to any disclaimer, the term of this patent is extended or adjusted under 35 U.S.C. 154(b) by 0 days.

(21) Appl. No.: 14/377,415

(22) PCT Filed: Jan. 24, 2013

(86) PCT No.: PCT/EP2013/051375
§ 371 (c)(1),
(2) Date: Aug. 7, 2014

(87) PCT Pub. No.: WO2013/120678
PCT Pub. Date: Aug. 22, 2013

(65) Prior Publication Data
US 2015/0340987 A1      Nov. 26, 2015

(30) Foreign Application Priority Data

Feb. 13, 2012   (DE) .......................... 20 2012 001 369
May 3, 2012     (DE) .......................... 20 2012 004 333

(51) Int. Cl.
*F24J 2/46*      (2006.01)
*F24J 2/52*      (2006.01)
(Continued)

(52) U.S. Cl.
CPC ................ *H01L 31/048* (2013.01); *F16M 7/00* (2013.01); *F16M 13/00* (2013.01); *F24J 2/523* (2013.01); *F24J 2/5233* (2013.01); *F24J 2/5239* (2013.01); *F24J 2/5254* (2013.01); *H01L 31/0422* (2013.01); *H02S 20/24* (2014.12);
(Continued)

(58) Field of Classification Search
CPC ......... H02S 20/22; H02S 20/23; H02S 20/24; H02S 20/30; F24J 2/54; F24J 2/5403; F24J 2/541; F24J 2002/5277; F16M 7/00; F16M 13/00
USPC ............... 211/41.1, 41.14, 41.15, 41.16, 201; 52/173.3
See application file for complete search history.

(56) References Cited

U.S. PATENT DOCUMENTS 8,505,248 B1 *  8/2013  Leong .................. H01L 31/024
                                                52/173.3
8,726,897 B2 *  5/2014  Wallgren ............... F24J 2/4638
                                                126/571
(Continued)

FOREIGN PATENT DOCUMENTS

DE    20 2007 008 150 U1    12/2007
DE    20 2007 006 094 U1    10/2008
(Continued)

OTHER PUBLICATIONS

PCT, "International Search Report for International Application No. PCT/EP2013/051375".

*Primary Examiner* — Joshua Rodden
(74) *Attorney, Agent, or Firm* — Manabu Kanesaka

(57) ABSTRACT

The invention relates to a device for supporting at least one solar panel comprising a rectangular frame (R) that includes two opposite struts (1, 2). The disclosed device comprises at least two supporting elements (S1, S2), each of which has a support bar (5), on one side (O) of which at least one first fastening element (6) for securing one (1) of the struts is provided. At least one support (7) is pivotally mounted on the support bar (5) at a specific distance from the first fastening element (6). The free end of said at least one support (7) includes a second fastening element (13) for securing the other one strut (2) lying opposite the one strut (1).

10 Claims, 4 Drawing Sheets

(51) Int. Cl.
  *H01L 31/048* (2014.01)
  *F16M 13/00* (2006.01)
  *F16M 7/00* (2006.01)
  *H01L 31/042* (2014.01)
  *H02S 20/30* (2014.01)
  *H02S 20/24* (2014.01)
  *F24J 2/54* (2006.01)

(52) U.S. Cl.
  CPC ................ *H02S 20/30* (2014.12); *F24J 2/526* (2013.01); *F24J 2002/4661* (2013.01); *F24J 2002/5288* (2013.01); *F24J 2002/5486* (2013.01); *Y02B 10/20* (2013.01); *Y02E 10/47* (2013.01)

(56) References Cited

U.S. PATENT DOCUMENTS

| | | | | |
|---|---|---|---|---|
| 9,038,329 B2 * | 5/2015 | Pelman | ................ | F24J 2/5233 136/244 |
| 2007/0144575 A1 * | 6/2007 | Mascolo | ................ | F24J 2/4636 136/246 |
| 2012/0036799 A1 * | 2/2012 | Kneip | ................ | F24J 2/523 52/173.3 |
| 2012/0186169 A1 * | 7/2012 | Tomaso | ................ | F24J 2/5233 52/173.3 |
| 2012/0186632 A1 * | 7/2012 | Reinhold | ................ | F24J 2/4638 136/251 |
| 2012/0273029 A1 * | 11/2012 | Bragagna | ................ | F24J 2/5233 136/251 |
| 2013/0112248 A1 * | 5/2013 | McPheeters | ................ | F16B 2/065 136/251 |
| 2014/0360111 A1 * | 12/2014 | Kuan | ................ | F24J 2/5205 52/173.3 |

FOREIGN PATENT DOCUMENTS

| | | | | |
|---|---|---|---|---|
| DE | 20 2010 005 563 U1 | 10/2010 | | |
| DE | 10 2009 022 746 A1 | 5/2011 | | |
| DE | WO 2011054943 A1 * | 5/2011 | ............ | F24J 2/5239 |
| DE | 10 2010 022 556 B3 | 6/2011 | | |
| DE | 10 2010 024 514 A1 | 12/2011 | | |
| DE | 102010060154 A1 * | 4/2012 | ............ | F24J 2/4638 |
| DE | 202012002547 U1 * | 4/2012 | ............ | F24J 2/5235 |
| EP | 2 182 303 A2 | 5/2010 | | |
| EP | 2 402 679 A2 | 1/2012 | | |
| JP | WO 2008105296 A1 * | 9/2008 | ............ | F24J 2/5235 |
| WO | 02/073703 A1 | 9/2002 | | |
| WO | 2011/054943 A1 | 5/2011 | | |

* cited by examiner

DEVICE FOR SUPPORTING AT LEAST ONE SOLAR PANEL

RELATED APPLICATIONS

The present application is National Phase of International Application No. PCT/EP2013/051375 filed Jan. 24, 2013, and claims priorities from German Applications No. 20 2012 001 369.6, filed Feb. 13, 2012; and No. 20 2012 004 333.1, filed May 3, 2012.

TECHNICAL FIELD

The invention relates to a device for supporting at least one solar panel.

BACKGROUND

Such a device is disclosed in WO 2011/054943 A1. The device comprises two support arrangements. Each of the support arrangements has a support bar, on one side of which a first fastening element is provided. The solar panel has a rectangular frame that includes two opposite struts. To set up the solar panel, the one strut is hung on the first fastening elements. Then, a pivoting support wall provided in the area of the other strut is folded out of a transport position into a support position and mounted, for example by means of screws or rivets, to second fastening elements that are also fastened to the support bar. Setting up the conventional solar panel requires fastening elements and a screwing or riveting tool. Apart from that, each type of support wall must have second fastening elements corresponding to it on the support bar. This makes its manufacturing expense relatively high.

The goal of the invention is to eliminate the disadvantages of the prior art. In particular, a device should be specified that allows rapid, simple, and secure support of solar panels on an essentially horizontal base, for example a flat roof. Another goal of the invention is for the device to be universal, i.e., to allow the setup of different commercially available solar panels.

This is accomplished by the features of the present embodiment.

BRIEF SUMMARY

The invention proposes that the support bar has, pivotally mounted on it at a predetermined distance from the first fastening element, at least one support, whose free end has a second fastening element to fasten the other one strut lying opposite the one strut.

It is simple and economical to manufacture the proposed device. It is suitable for setting up many differently designed solar panels.

It is advantageous for the support to be a U-profile. The proposed support can support heavy loads, which can be caused by snow or wind, for example.

According to one embodiment, the U-profile has a base section and two legs opposite one another that extend away from the base section at a distance greater than the width of the support bar, so that when folded the U-profile partially surrounds the support bar. When folded to be transported, the proposed support arrangement has an especially low volume.

According to another embodiment of the invention, the U-profile's base section widens in the direction of its free end. I.e., in the area of the second fastening element the support is wider than it is at the support bar. This makes the device especially universal. In particular, it is also suitable to support solar panels that have a reinforcing element inserted in the corner area of the frame.

It is advantageous for each leg to have a pivot fastening section that extends over the U-profile's base section and that has a first opening. The opposite pivot fastening sections of a support lie against the side walls of the support bars. A fastening element, for example a rivet or something similar, is passed through the first opening, allowing the support to pivot about a pivot axis running through the first openings.

In an especially advantageous embodiment of the invention, the second fastening element is formed of fastening sections that extend over the U-profile's base section, each of which has a recess to engage into the other one strut. It is expedient for the recess to be designed so that it surrounds at least sections of the other one strut.

The struts can be made from an L-profile or of another U-profile and be arranged in such a way that frame legs of the opposite struts face one another, the recess being a slot corresponding to the frame leg. I.e., it is advantageous for the recess to be designed so that when the support swings it engages into the inward-facing free leg of the frame, securing the frame from being lifted off the support. Thus, in this case the solar panel is fastened, both with the first fastening element and also with the second fastening element, exclusively at the free frame legs of the opposite struts. This makes the device especially universal. In particular, no special fastening elements are provided, designed for different frame heights, for example.

It is expedient for one width of the slot to increase in the direction toward the slot opening. It is also expedient for at least one edge of the slot to have a radius. A suitable embodiment of the slot allows the support to latch with the frame leg or to be fastened by wedging it against the frame leg. This allows especially rapid and simple setup of the solar panel. In addition, the free end of the support can have a securing section that extends from the U-profile's base section and that is bent back in the direction toward the recess. The securing section is, e.g., a sheet metal tongue or tab. Bending the securing section back is a simple way to allow the support to be secured to the frame, i.e., it is then no longer possible for the support to be folded back in the direction of the support bar. Apart from this, the securing section can fix the frame or the frame leg of the other strut in the slot of the support's second fastening element.

It is advantageous for the support to have a second opening at its free end, preferably on the securing section. The second opening allows latching or frictional engagement of a second securing section. If the second opening is on the securing section, the securing section can be bent into a securing position simply by inserting a screwdriver, for example.

According to another embodiment, the U-profile's base section has two third openings. It is expedient for the supports of two support bars arranged next to one another to be connected with a connecting wall. It is expedient for the connection wall to have fourth openings corresponding to the third openings to allow fastening elements, in particular rivets, to pass through. The fourth openings can be drill holes and/or elongated holes. It is expedient for each of the third openings to have several fourth openings. This makes it easier to fasten the connection wall, especially if the underlying surface is not completely level.

Instead of the third and fourth openings, the supports' base section can also have, for example, sheet metal tongues, into which corresponding sheet metal tabs or other slots on the connection walls can be frictionally engaged.

The connection wall can have a bent section parallel to its longitudinal edges that points away from the supports in the area of their free ends. It is advantageous for the bent section to form an acute angle with the supports. Consequently, there is a gap between an upper longitudinal edge of the solar panel and the bent section of the connection wall. The gap allows ventilation behind the solar panels, and thus cooling in the summer.

It is expedient for one length of the connection wall to correspond approximately to one length of the solar panel. The connection wall is intended to block wind.

According to another embodiment of the invention, the other side of the support bar facing away from the first side has elastomer elements on it, which are preferably extruded. The elastomer elements can be similar to a U-profile and partially surround the support bar on the sides. The elastomer elements can have an extended tongue on their fastening side. In this case, it is expedient for the support bar to have a groove on the other side to fasten the tongue. The support bar can be a square profile, preferably extruded.

BRIEF DESCRIPTION OF THE DRAWINGS

A sample embodiment of the invention is explained in detail below using the drawing. The figures are as follows:

FIG. 3 a side view of a support arrangement with the support folded in;

DETAILED DESCRIPTION OF THE INVENTION

Figure 1:
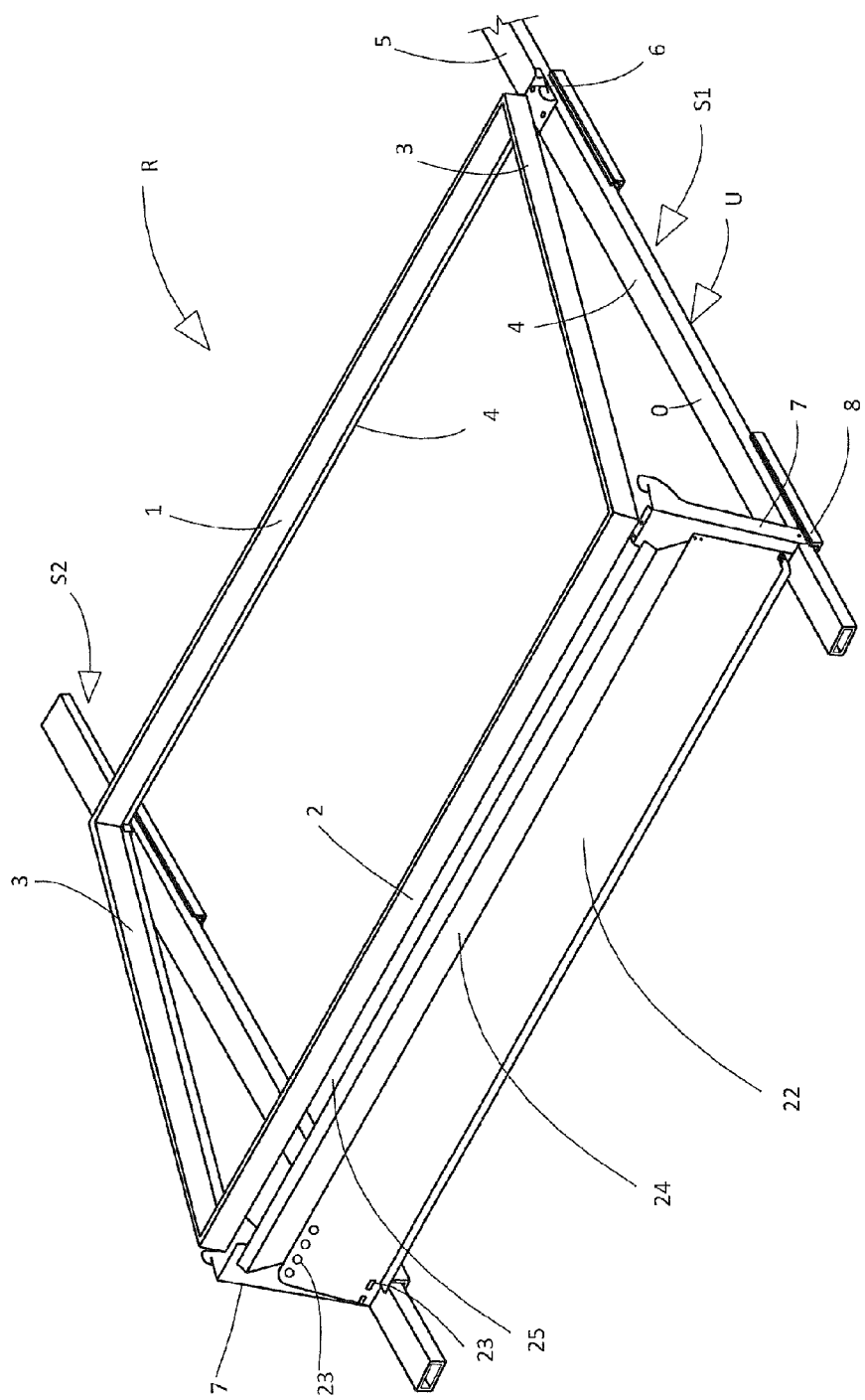
FIG. 1 a perspective view of the device.

In FIG. 1, a solar panel (not completely shown here for clarity) has a rectangular frame R with a first long strut 1 and a second long strut 2 opposite it, as well as opposite short struts 3. Here, each of struts 1, 2, 3 is in the form of an L-profile, and the free frame legs 4 of opposite struts 1, 2, and 3 each face one another.

Reference numbers S1 and S2 designate support arrangements. Each support arrangement S1, S2 has a support bar 5 formed by a rectangular tube, for example. The top side O of support bar 5 has a first fastening element 6 mounted on it. A support 7 is pivotally mounted on support bar 5 at a specific distance from first fastening element 6. Reference number 8 designates elastomer elements that are mounted on a bottom side U of support bars 5 and are secured by means of an adhesive, for example.

Figure 2:
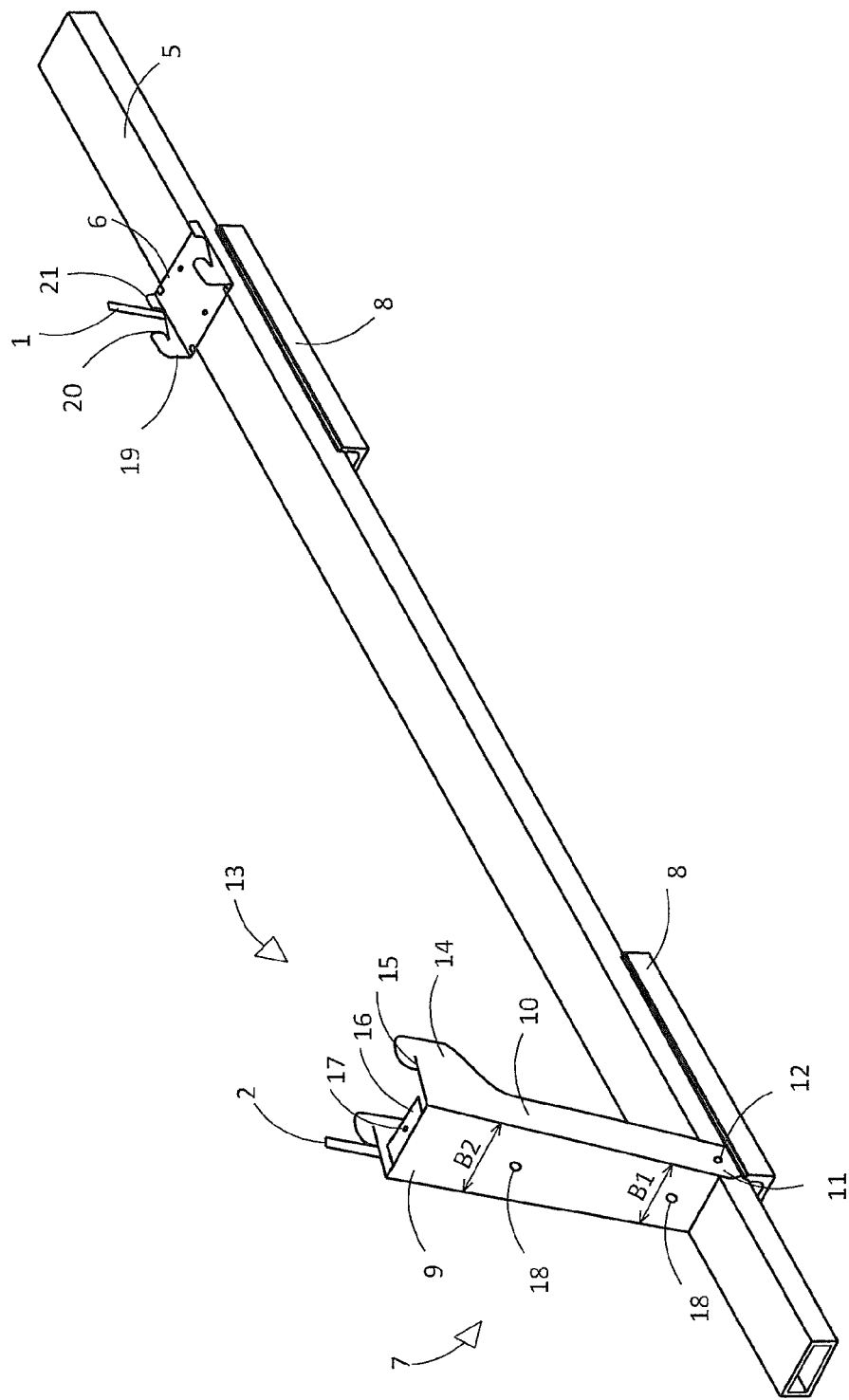
FIG. 2 a perspective view of a support arrangement as shown in FIG. 1.

Support 7 is in the form of a U-profile, as is especially apparent in FIG. 2. It has a base section 9 and two opposite legs 10 extending away from the base section. Legs 10 both have pivot fastening sections 11 extending away from them that have a first opening 12, through which fasteners (not shown here) pass to hold support 7 on support bar 5 in such a way that it can pivot. A first width B1 of the U-profile's base section 9 near pivot fastening sections 11 is smaller than a second width B2 near a free end of support 7. Thus, U-profile's base section 9 has a trapezoidal shape. A fastening element 13 at the free end of support 7 comprises fastening sections 14, which extend from legs 10. Each fastening section 14 has a slot 15 that opens toward the U-profile's base section 9. The free end of the U-profile's base section 9 also has a securing section 16 formed by a tab bent back by about 90° from base section 9. Securing section 16 has a second opening 17. Reference number 18 designates third openings in the U-profile's base section 9.

First fastening element 6, similar to second fastening element 13, has other fastening sections 19, each of which has another slot 20. Fastening element 6 is mounted on the top O of support bar 5 in such a way with respect to support 7 that the other slot 20 opens in the opposite direction to slot 15. Opposite each opening of the other slot 20 there is a support element 21. Reference number 1 designates the first strut.

Figure 3:
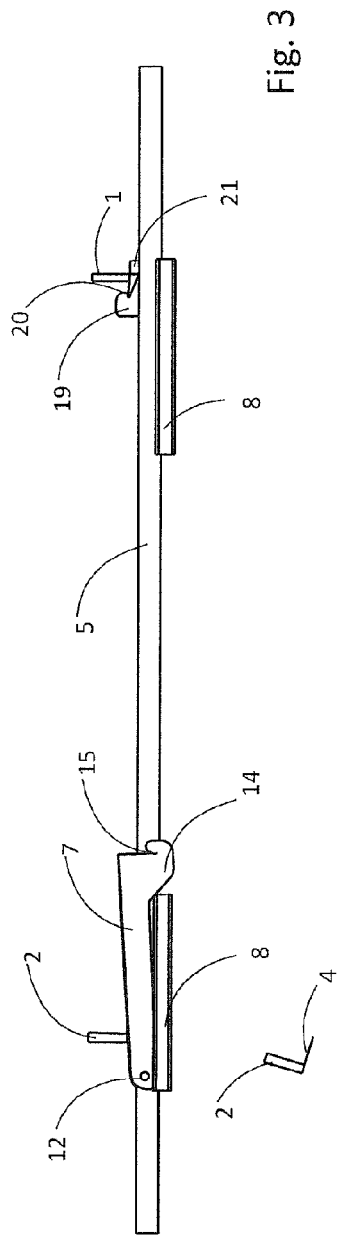
Figure 4:
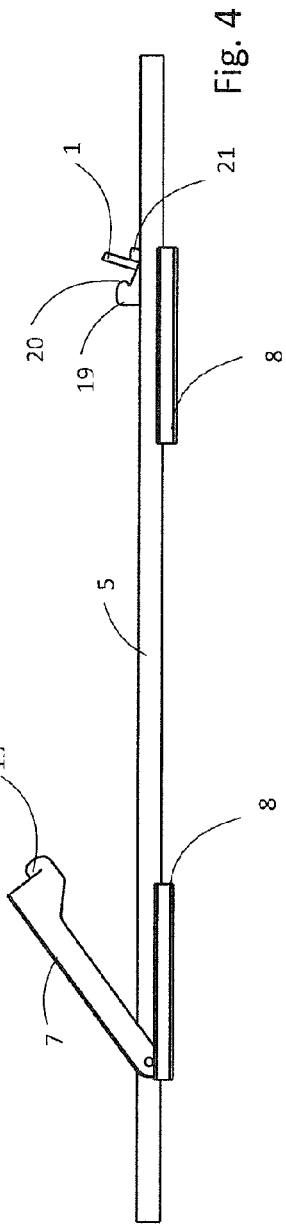
FIG. 4 the side view shown in FIG. 3 with a support partly swung up.
Figure 5:
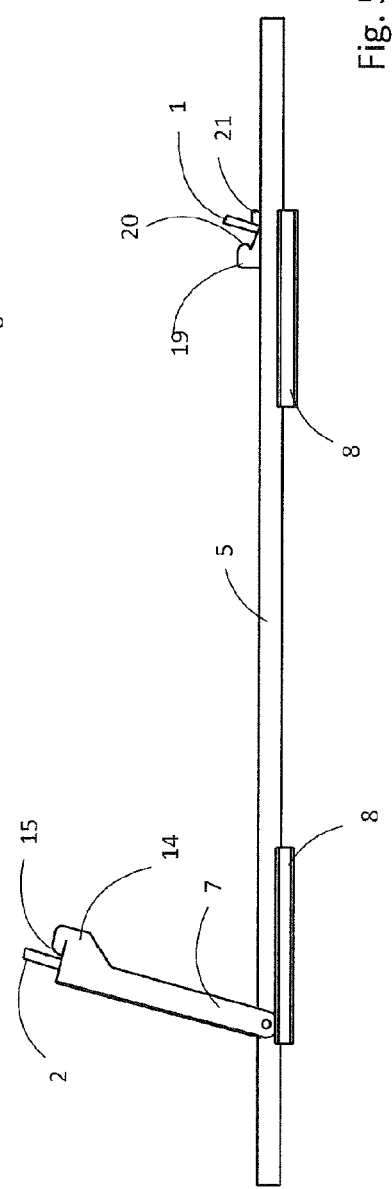
FIG. 5 the side view shown in FIG. 3 with a support completely swung up.

The function of the device will now be explained in detail, in particular using FIG. 3 through 5.

To set up a solar panel, first two support bars 5 are oriented parallel to one another at a suitable distance, so that first fastening elements 6 lie next to one another. Supports 7 are folded in, as shown in FIG. 3. Then, the one frame leg 4 of first strut 1 is inserted into the other slot 20 of first fastening element 6.

After that, second strut 2 of frame R is raised. This makes first strut 1 lie against support element 21. This keeps first strut 1 from moving in the direction in which support bar 5 extends. This is shown in FIG. 4.

Swinging support 7 up farther makes slot 15 engage in frame leg 4 of second strut 2. In a suitable embodiment of slot 15, the second fastening element 13 designed in this way latches with the second strut 2. The latching can be secured by bending up the securing tab afterwards.

Finally, the connection wall, designated with reference number 22 in FIG. 1, can be fastened to two adjacent supports 7. Connection wall 22 has fourth openings 23 for this purpose. Connection wall 22 also has a bent section 24, so that when connection wall 22 is attached a gap 25 is formed between a lower edge of second strut 2 and connection wall 22, allowing ventilation behind the solar panel.

Instead of first 6 and second fastening elements 13, it is also possible for differently designed fastening elements to be provided, for example clamping, latching, or plug-type elements.

Instead of securing section 16, it is also possible to use a conventional latchable securing element to keep support 7 folded out. Such a securing element can, for example, be inserted into or latched in second opening 17. It can be a synthetic or elastomer element, for example.

Figure 6:
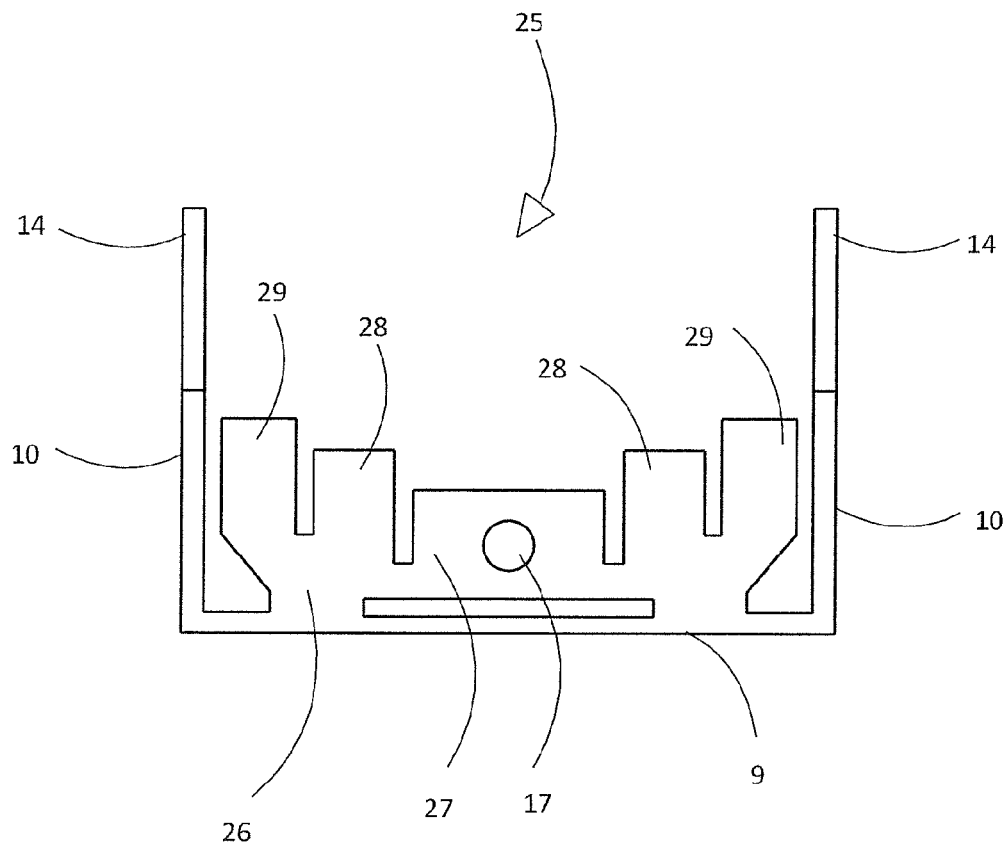
FIG. 6 a top view of another support.

FIG. 6 shows a top view of another support 25. The other support 25 has another securing section 26. The other securing section 26 in turn is essentially symmetrical and has a first tongue 27, which has opening 17. First tongue 27 has second tongues 28 on both sides of it, and the second tongues have third tongues 29 on both sides of them. The first 27, second 28, and third tongues 29 are all separated from one another by notches. First tongue 27 extends with a first depth in the direction of fastening section 14, second tongues 28 extend with a second depth in the direction of fastening section 14, and third tongues 29 extend with a third depth in the direction of fastening section 14. The first depth is smaller than the second depth, and the second depth is smaller than the third depth. The proposed embodiment of the other securing section 26 allows differently designed second struts to be fastened by means of the other support 25. For example, inserting a tool into second opening 17 also allows securing of second struts 2 that extend over the third tongues 29, for example. In this case, such struts can be secured by bending up the first 27 and the second tongues 28. Thus, the proposed other support 25 is universally suitable for fastening many commercially available solar panels.

It is advantageous for first fastening element 6 and support 7 to be made of laser-cut pieces of sheet metal whose edges are then broken. It is expedient for both first fastening element 6 and support 7 to be made of a single piece.

Especially FIG. 1 shows how first fastening element 6 and second fastening element 13 each support one solar panel. However, the fastening element 6 and the second fastening element 13 each may support two adjacent solar panels. This makes the device especially efficient. It allows many solar panels to be set up with small installation and manufacturing expense.

Although the figures do not show this, it is possible for several first fastening elements 6 and supports 7 with second fastening elements 13 to be mounted in alternation on one support bar 5. I.e., in this case one support arrangement S1, S2 can be used to support several solar panels one behind the other, further improving the device's efficiency.

LIST OF REFERENCE NUMBERS

1 First strut
2 Second strut
3 Short strut
4 Frame leg
5 Support bar
6 First fastening element
7 Support
8 Elastomer element
9 U-profile base section
10 Leg
11 Pivot fastening section
12 First opening
13 Second fastening element
14 Fastening section
15 Slot
16 Securing section
17 Second opening
18 Third opening
19 Other fastening section
20 Other slot
21 Support element
22 Connection wall
23 Fourth opening
24 Bent section
25 Gap
26 Other securing section
27 First tongue
28 Second tongues
29 Third tongues
B1 First width
B2 Second width
O Top
R Frame
S1 First support arrangement
S2 Second support arrangement
U Bottom The invention claim is:

1. A device for supporting at least one solar panel having a rectangular frame with two opposite struts, comprising:
at least two support arrangements, each of which has a support bar including
at least one first fastening element on one side of the support bar for securing one of the two opposite struts, and
at least one support pivotally mounted on the support bar at a predetermined distance from the first fastening element, and including a free end having a second fastening element for securing the other of the two opposite struts lying opposite the one of the two opposite struts, the at least one support being in a form of a U-profile that has a base section and two legs opposite one another that extend away from the base section at a distance greater than a width of the support bar, so that when folded, the U-profile partially surrounds the support bar,
wherein the second fastening element is formed of fastening sections that extend over the base section, each of which has a slot for engaging into the other of the two opposite struts, and
the free end of the support has a securing section that extends from the base section and that is bent back in the direction toward the slots.

2. The device described in claim 1, wherein the base section widens in the direction of the free end of the support.

3. The device described in claim 1, wherein the two legs have pivot fastening sections that extend over the base section and that have a first opening.

4. The device described in claim 1, wherein a width of the slot increases in a direction toward an opening of the slot.

5. The device described in claim 1, wherein the support has a second opening at the free end thereof.

6. The device described in claim 1, further comprising a connection wall connecting the supports of the two arrangements.

7. The device described in claim 6, wherein the base section has two third openings.

8. The device described in claim 7, wherein the connection wall has fourth openings corresponding to the third openings to allow fasteners to pass through.

9. The device described in claim 7, wherein the connection wall has a bent section parallel to longitudinal edges of the connection wall that points away from the supports in an area of the free ends.

10. The device described in claim 1, wherein the other side of the support bar facing away from the first fastening element has elastomer elements.

* * * * *